(12) United States Patent
Ramaswamy

(10) Patent No.: US 6,670,828 B2
(45) Date of Patent: Dec. 30, 2003

(54) PROGRAMMABLE TERMINATION FOR CML I/O

(75) Inventor: Sridhar Ramaswamy, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 52 days.

(21) Appl. No.: 10/062,615

(22) Filed: Jan. 31, 2002

(65) Prior Publication Data

US 2003/0141895 A1 Jul. 31, 2003

(51) Int. Cl.[7] .................. H03K 19/0175; H03K 19/003
(52) U.S. Cl. .......................................... 326/83; 326/30
(58) Field of Search .............................. 326/30, 80–83, 326/86–87, 115, 127

(56) References Cited

U.S. PATENT DOCUMENTS

| | | | | |
|---|---|---|---|---|
| 5,134,311 A | * | 7/1992 | Biber et al. ................. | 327/108 |
| 5,909,127 A | * | 6/1999 | Pearson et al. ............. | 326/115 |
| 5,966,032 A | * | 10/1999 | Elrabaa et al. ............... | 326/84 |
| 6,362,644 B1 | * | 3/2002 | Jeffery et al. ................ | 326/30 |

* cited by examiner

*Primary Examiner*—James H. Cho
(74) *Attorney, Agent, or Firm*—Alan K. Stewart; W. James Brady, III; Frederick J. Telecky, Jr.

(57) ABSTRACT

A programmable termination circuit (12) selectively providing a termination voltage to a driver or receiver of a high-speed serial link, such as CML I/O's. The programmable termination circuit (12) is adapted for use both at a transmitter front end (10) and at a receiver front-end (20) to selectively terminate the respective circuit to one of multiple available voltage supplies (VDDA, VDDT), such as 1.8 volts and 3.3 volts. The programmable termination circuit is software controllable via a single control signal (TS). A level shifter (14) circuit is provided for coupling the termination control signal (TS) to the programmable termination circuit (12) to level shift the termination control signal to a logic level suitable with large FETs (M1, M2) coupled to and controlling the connection of the voltage supplies. A back gate control circuit (40) is also provided to ensure that PMOS back gates of the large FETs (M1, M2) are tied to the highest supply available at any instant to avoid forward biasing of the diodes. The gate control circuit ensures that the gates of these PMOS devices are tied to the larger voltage supply should one supply be powered down.

20 Claims, 3 Drawing Sheets

US 6,670,828 B2

PROGRAMMABLE TERMINATION FOR CML I/O

FIELD OF THE INVENTION

The present invention is generally related to CML I/O driver and receiver circuits, and more particularly to high-speed serial links required to operate from multiple voltages at either end of the high-speed link.

BACKGROUND OF THE INVENTION

High-speed serial links are typically used for chip-to-chip and board-to-board communications. One particular type of high-speed serial link is known as a CML differential data link including a requisite output driver at the transmitter, and a corresponding differential receiver.

In some current applications, there is a need that the output driver circuit and receiver circuit be capable of operating from multiple voltage levels, such as 1.8 volts and 3.3 volts due to legacy constraints. Thus, there is a desire that the transmitter be operable to operate from multiple voltages, as well as the receiver front-end, preferably under software control.

SUMMARY OF THE INVENTION

The present invention achieves technical advantages as a programmable voltage termination circuit for a high-speed serial link, such as a CML serial link, that has software controlled termination voltages allowing both a transmitter and a receiver front-end to operate from multiple voltages under software control.

The present invention includes a programmable termination circuit adapted for use in both a transmitter and a receiver front-end that selectively couples one of several available terminating voltages to the respective circuit. The programmable termination circuit includes a combination of NMOS and PMOS FET's, selectively coupling the desired termination voltage to the circuit upon software control, such as using a termination select signal. A level shift circuit is utilized to voltage shift this termination signal to be operable at the higher voltage level. A plurality of control signals are provided as outputs from the level shifter circuit and are used in gate control circuitry of the programmable termination circuit.

A back gate control circuit is further provided to address the possibility that one of the voltage supplies may come online before the other. This back gate control circuit controls PMOS switch devices of the programmable termination circuit so that there is no forward bias diode leakage during power up. The back gate control circuit ensures that the PMOS back gates are tied to the highest supply available at any instant to avoid forward biasing the diodes. The gates of the PMOS devices have additional control circuitry insuring that the gates are tied to the back gates if the higher supply voltage is power down, advantageously leading to a high impedance termination and shutting off the respective driver/receiver.

DETAILED DESCRIPTION OF THE PREFERRED EMBODIMENT

Figure 1:
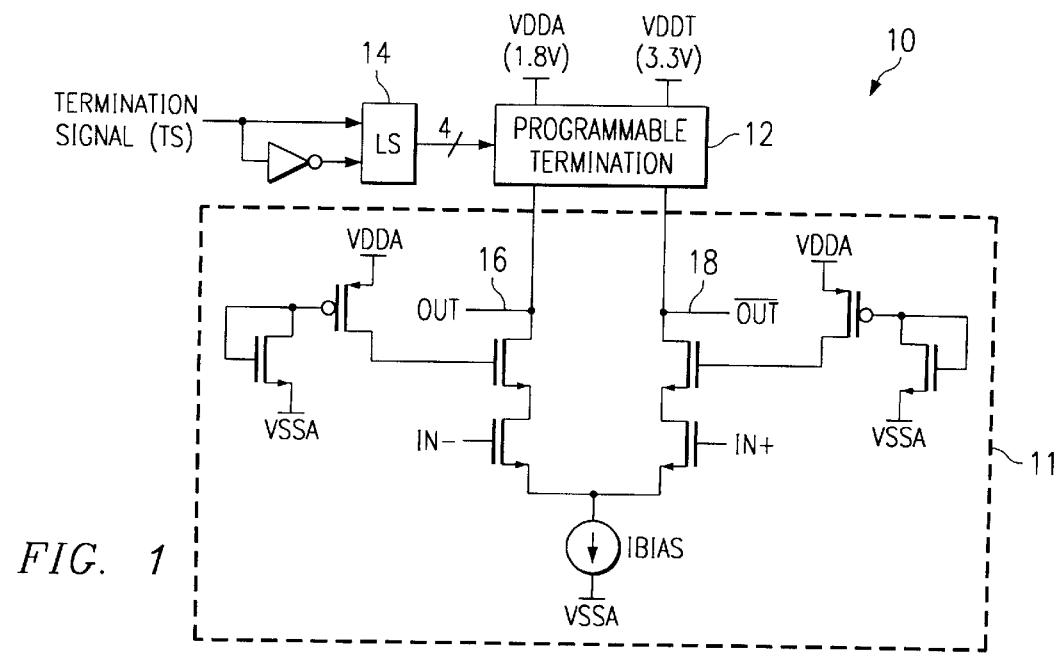
FIG. 1 is a schematic diagram illustrating a transmitter front end including a CML driver with a programmable termination block.

Referring now to FIG. 1, there is generally shown at 10 a schematic diagram of a transmitter front-end showing a CML driver 11 integrated with a programmable termination block 12 according to the present invention. The programmable termination block 12, under software control, selectively provides one of several termination voltages to the CML driver circuit, depicted as voltage supply VDDA, which may be a 1.8 volt power supply, and voltage supply VDDT, which may be a 3.3 voltage supply, although limitation to these voltages is not to be inferred. The programmable termination circuit 12 operates under software control utilizing a termination control signal (TS) coupled via a level shifter circuit 14, as shown. The termination signal TS provides software control by selectively tying one of these termination voltages to the CML driver, as shown. Preferably, this termination signal TS operates at a lower voltage level, commensurate with the lower voltage supply such as VDDA, and thus, the level shifter circuit 14 is provided to level shift the termination logic signal from the lower voltage to a higher voltage being commensurate with the upper voltage supply VDDT. In this example, a 1.8 volt termination signal TS is level shifted to 3.3 volts being commensurate with the VDDT power supply. The logic high output of the driver provided on lines 16 and 18 is nearly the terminated voltage, and may be only 50 mV below this termination voltage due to the voltage drop across FETs of the termination circuit 12, as shown in FIG. 3.

Figure 2A:
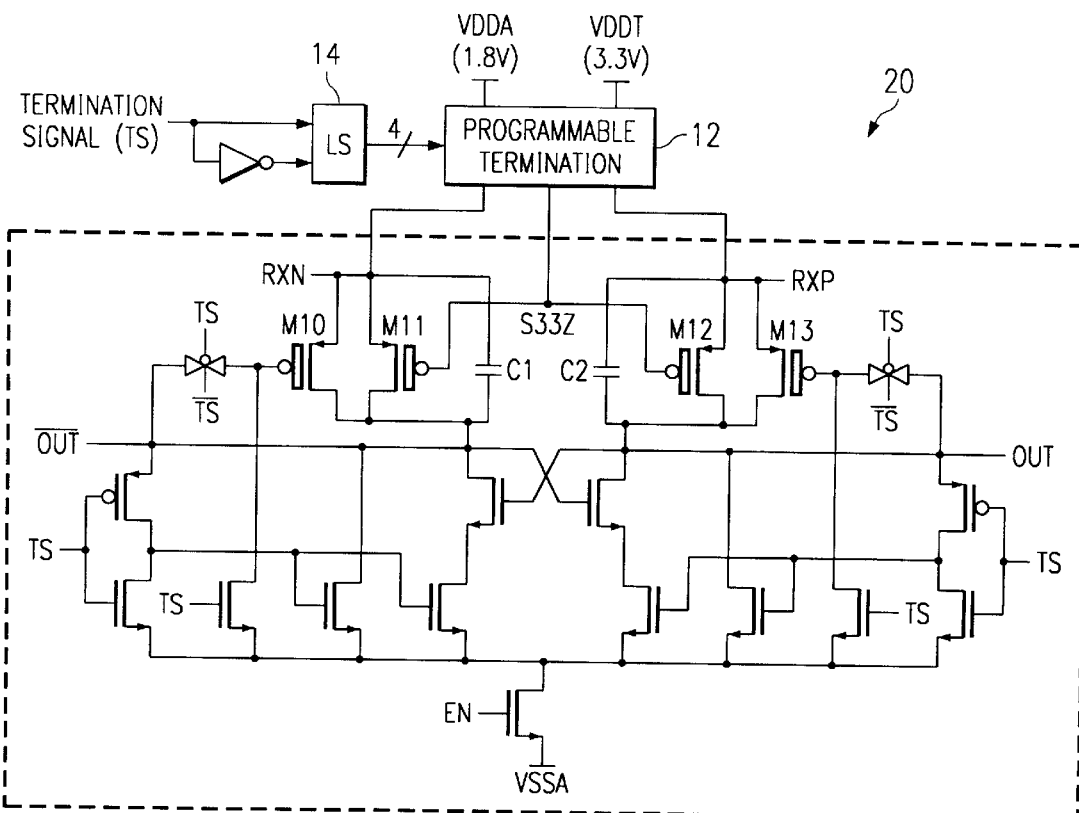
FIG. 2 is a schematic diagram illustrating a receiver front-end including the same programmable termination block operable in combination with a level shifter (LS) circuit.
Figure 2B:
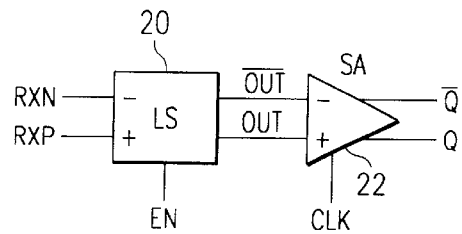

Referring to FIG. 2A, there is shown a receiver front-end 20 incorporating the programmable termination block 12 and the level shifter 14, this receiver front-end feeding a differential receiver 22 as depicted in FIG. 2B. Like the transmitter front-end 10 shown in FIG. 1, the termination control signal TS provides software control of the programmable termination circuit 12 to selectively terminate one of multiple voltage supplies to the receiver front-end, such as voltage supply VDDA and VDDT, which may be 1.8 volt and 3.3 volt power supplies, respectively. FETs M10, M11, M12 and M13 are large 3.3 volt tolerant FETs, while the remaining FETs are 1.8 volt tolerant smaller FETs.

Figure 3:
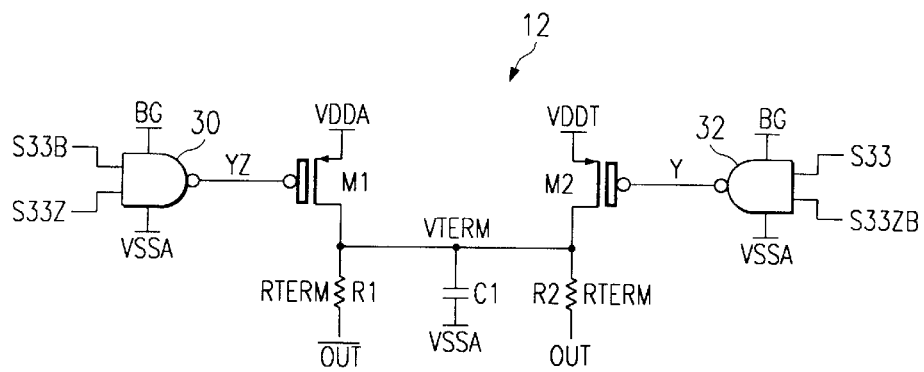
FIG. 3 is a schematic diagram of the programmable termination circuit including large PMOS devices driven by control circuitry to selectively couple the desired operating voltage to a common termination node coupled to output lines OUT and $\overline{OUT}$.
Figure 4:
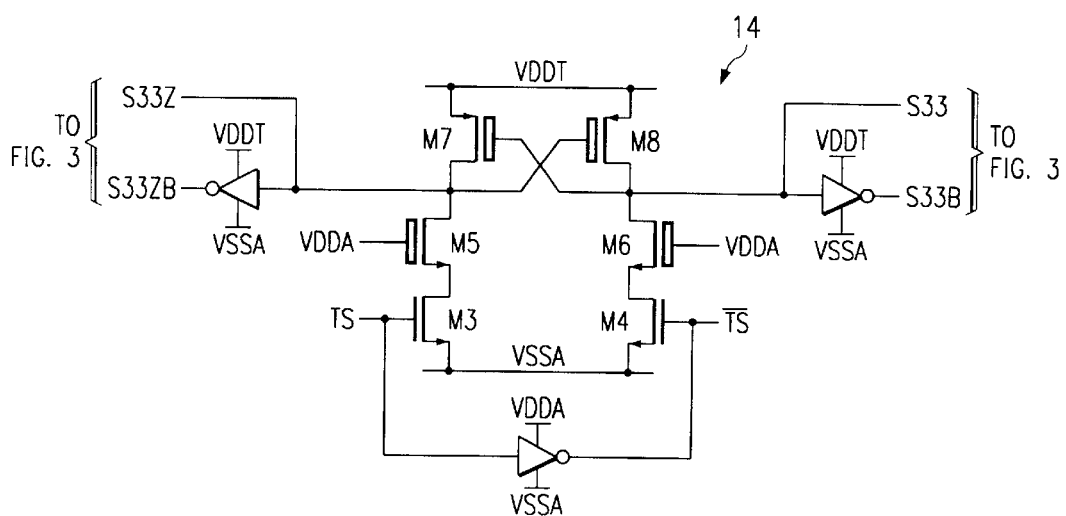
FIG. 4 is a schematic diagram of the level shifter circuit seen to produce four output signals coupled to the programmable termination circuit of FIG. 3 for controlling the operation thereof including the PMOS devices.

Referring now to FIG. 3, there is shown a detailed schematic diagram of the programmable termination circuit 12 according to a preferred embodiment of the present invention. As shown, a first large PMOS FET M1 is seen to selectively couple a first power supply VDDA to a common voltage rail VTERM, and a second large PMOS FET M2 is seen to selectively couple a second voltage supply VDDT to this same voltage termination rail VTERM. A control signal YZ is coupled to the gate of FET M1, and controls the operation thereof. Likewise control signal Y is coupled to the gate of FET M2, and controls the operation thereof. A respective logic block 30 and 32 is seen to provide the respective control signal YZ and Y, the first logic block 30 having inputs identified as S33B, and S33Z. The other logic control block 32 provides the control signal Y, and has corresponding inputs S33 and S33ZB. These four control signals are all provided by level shifter circuit 14, as shown in FIG. 4. Control signal YZ enables FET M1 to responsibly couple the voltage supply signal VDDA to the VTERM node, while control signal Y enables FET M2 to correspondingly couple the voltage VDDT to the same VTERM node. The control signals provided to logic blocks 30 and 32 control the timing such that only one selected voltage supply is at any one time coupled to the termination node VTERM. Each FET M1 and M2 has a minimal voltage drop of about 50 mV when enabled, allowing the transmitted/received data signal to very nearly equal the selected termination voltage.

Referring now to FIG. 4, there is shown a schematic diagram of the level shifter 14 providing the four logic control signals to the programmable termination circuit 12 of FIG. 3. Level shifter 14 is seen to be controlled by the termination logic signal TS, whereby logic signal TS and it's compliment $\overline{TS}$ control respective 1.8 volt NMOS FET M3 and M4. The voltage supply VDDA is coupled to the gate of two 3.3 volt NMOS transistors M5 and M6, which are cross coupled to the higher voltage supply VDDT via large PMOS FETs M7 and M8, as shown. When termination signal TS is enabled, the logic signals S33 and S33ZB via logic 32 enable FET M2 to couple the larger voltage supply VDDT to the voltage termination node VTERM. Likewise, when the termination TS is not enabled, i.e. logic low, the logic signals S33B and S33Z via logic 30 enable corresponding FET M1 to couple the lower voltage supply VDDA to the common voltage termination node VTERM.

Advantageously, level shifter 14 is used to translate the 1.8 volt termination signal TS to a 3.3 volt logic level, providing the 3.3V output signals S33, S33Z, S33B and S33ZB as outputs of the level shifter which are used instead, which four output signals are used in the gate control circuitry for the PMOS switches M1 and M2 shown in FIG. 3.

Referring back to FIG. 1, this output driver 11 is a cascaded NMOS differential pair with a resistive load software controlled to operate off of 1.8 volts or 3.3 volts as provided by the selected voltage supply VDDA or VDDT. The control signals Y and YZ are connected to the gates of the big PMOS devices M1 and M2, as shown in FIG. 3. An extra filter capacitor C1 preferably having a value of 25 pF, is provided to the termination resistors R1 and R2 to advantageously reject supply noise being coupled into the termination node VTERM. The 3.3 volt tolerant PMOS devices M1 and M2 are sized in silicon so that there is less than 50 mV drop across them under normal operations.

Figure 5:
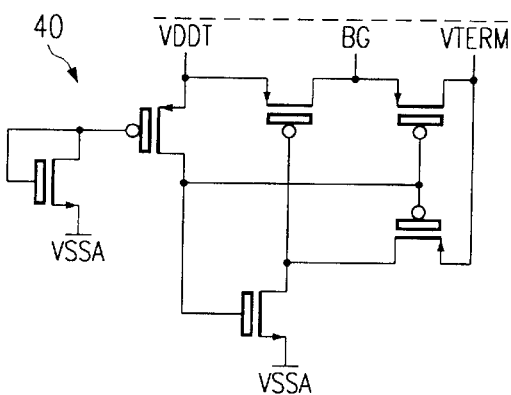
FIG. 5 is a schematic diagram of a back gate control circuit coupled between the two operable voltage supplies and the voltage termination line VTERM.

During power up, it is entirely possible for one of the supplies VDDA or VDDT to come online before the other. For example, the 1.8 volt supply VDDA could come up before the 3.3 volt supply VDDT. During that time, the back gates of the PMOS switch devices M1 and M2 as shown in FIG. 3 need to be controlled so that there is no forward bias diode leakage during power up. In order to prevent significant current surges during power up, there is provided a back gate control circuit 40, as shown in FIG. 5, which is coupled between the higher supply VDDT, and the voltage termination node VTERM, as shown. The back gate control circuit 40 generates the signal BG which ensures that the PMOS back gates of FET's M1 and M2 of termination circuit 12 are tied to the highest supply available at any instant, to avoid forward biasing the diodes. The gates of the PMOS devices M1 and M2 have additional control circuitry which ensure that the gates are tied to the signal BG if the 3.3 volt supply is powered down, and advantageously leading to a high impedance termination and shutting off of the CML driver and receiver. In fact if either supply VDDA or VDDT are powered down, the NAND gates powered by the signal BG ensure that the signals Y and YZ are tied to signal BG and therefore turn off FET M1 and M2.

Figure 6A:
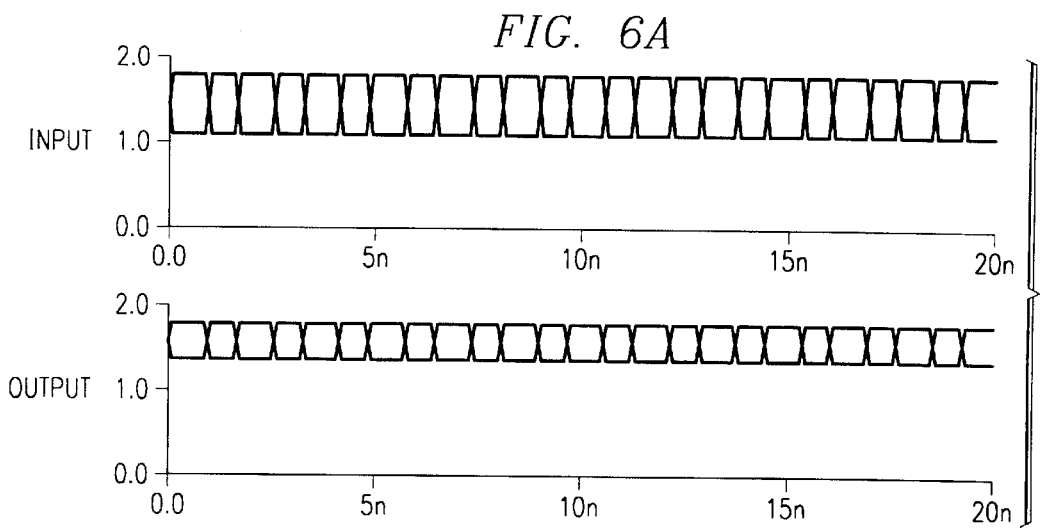
FIG. 6A and FIG. 6B illustrate simulation results showing the operation of the same CML driver terminated by two different termination voltages.
Figure 6B:
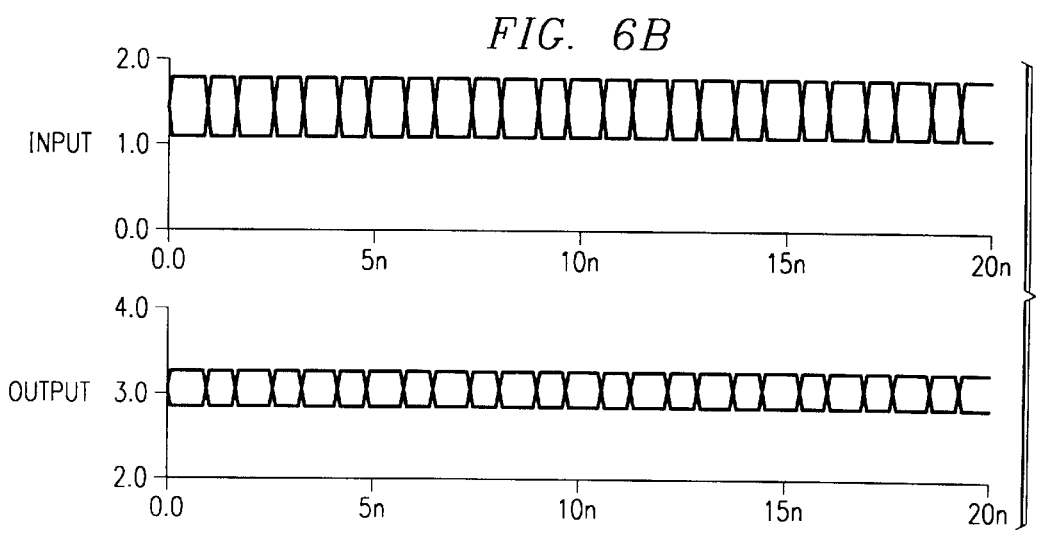

Referring now to FIGS. 6A and 6B, there is shown the operation of the same CML driver 10 operating with two different termination voltages VDDA and VDDT. FIG. 6A illustrates the operation of the CML driver 10 when operating from the lower termination voltage supply VDDA, and FIG. 3B illustrates the operation of the same CML driver when operating from the higher termination voltage supply VDDT. As illustrated, the CML driver is advantageously adapted to operate from two different voltage sources, providing dual voltage operation, using a software programmable termination circuit 12 at both the transmitter and the receiver. The input signal in both FIG. 6A and FIG. 6B is terminated at 1.8 volts, while the output signal in FIG. 6A is terminated at 1.8V while in FIG. 6B the output is terminated at 3.3 volts, as shown.

In summary, the present invention achieves technical advantages as a programmable termination circuit operable with both the transmitter and a receiver front end including CML I/O's allowing for the respective devices to terminate to one of multiple available voltage supplies, such as 1.8 volts or 3.3 volts. The programmable termination circuit is operable under the software control of a single control line TS, and preferably is interfaced via a level shifter circuit. The back gate control circuit ensures that the large PMOS FET's back gates are always tied to the highest supply available at any instance to avoid forward biasing of the respective diodes.

Though the invention has been described with respect to a specific preferred embodiment, many variations and modifications will become apparent to those skilled in the art upon reading the present application. It is therefore the intention that the appended claims be interpreted as broadly as possible in view of the prior art to include all such variations and modifications.

I claim:

1. A software programmable termination circuit, comprising:
    a first input adapted to couple to a first voltage;
    a second input adapted to couple to a second voltage, said second voltage being greater than said first voltage;
    a termination node;
    a control circuit coupled to said first and second input and adapted to selectively couple said first voltage and said second voltage to said termination node, said control circuit being responsive to a termination control signal; and
    a level shifter circuit coupled between said termination control signal and said control circuit.

2. The software programmable termination circuit as specified in claim 1 wherein said control circuit is responsive to said termination control signal having a voltage being less than said second voltage.

3. The software programmable termination circuit as specified in claim 1 wherein said level shifter circuit increases the voltage level of the termination control signal as applied to said control circuit.

4. The software programmable termination circuit as specified in claim 3 wherein said level shifter circuit generates multiple control signals in response to said termination control signal, said multiple control signals controlling said control circuit.

5. The software programmable termination circuit as specified in claim 1 wherein said control circuit comprises FETs, further comprising a back gate control circuit coupled to said FETs providing that the gates of said FETs are coupled to the highest available voltage provided as said first voltage and said second voltage, at any instant.

6. The software programmable termination circuit as specified in claim 5 wherein said FETs comprise PMOS FETs.

7. The circuit as specified in claim 5 comprising a pair of said FETs, one said FET being coupled to each of the respective first input and second input, wherein the gate of each said FET is tied to a high impedance when said respective voltage is not supplied to said respective first and second input of the software programmable termination circuit.

8. The circuit as specified in claim 1 wherein said software programmable termination circuit is adapted to provide either said first voltage or said second voltage as a termination voltage to a common node of a CML driver circuit coupled to said termination node.

9. The software programmable termination circuit as specified in claim 1 wherein said programmable termination circuit is adapted to provide either said first voltage or said second voltage as a termination voltage to a common node of a CML receiver front end circuit coupled to said termination node.

10. The software programmable termination circuit as specified in claim 1 wherein said first voltage comprises about 1.8 volts and said second voltage comprises about 3.3 volts.

11. The software programmable termination circuit as specified in claim 1 further comprising a CML driver circuit coupled to the termination circuit and terminated at said termination node to either said first voltage or said second voltage under control of said control circuit.

12. The software programmable termination circuit as specified in claim 1 further comprising a CML front-end receiver circuit coupled to the termination circuit and terminated at said termination node to either said first voltage or said second voltage under control of said control circuit.

13. A method of selectively providing one of several termination voltages to a driver circuit, comprising the steps of:
   operating a control circuit to selectively terminate the driver circuit to either a first voltage or a second voltage being higher than said first voltage, wherein said control circuit selectively terminates the driver circuit to either said first voltage or said second voltage as a function of a software programmable control signal, wherein said software programmable control signal has a peak voltage being said first voltage.

14. The method as specified in claim 13 wherein a level shifter circuit couples said software programmable control signal to said control circuit.

15. The method as specified in claim 13 wherein said control circuit has FETs, further comprising the step of using a back gate control circuit to establish the highest available said first or second voltage to said FET gates at any time.

16. The method as specified in claim 13 wherein said driver circuit is a CML driver.

17. A method of selectively providing one of several termination voltages to a receiver front-end, comprising the steps of:
   operating a control circuit to selectively terminate the driver circuit to either a first voltage or a second voltage being higher than said first voltage, wherein said control circuit selectively terminates the driver circuit to either said first voltage or said second voltage as a function of a software programmable control signal, wherein said software programmable control signal has a peak voltage being said first voltage.

18. The method as specified in claim 17 wherein a level shifter circuit couples said software programmable control signal to said software programmable control circuit.

19. The method as specified in claim 17 wherein said control circuit has FETs, further comprising the step of using a back gate control circuit to establish the highest available said first or second voltage to said FET gates at any time.

20. The method as specified in claim 17 wherein said receiver front-end is a CML receiver.

* * * * *